(12) United States Patent
Sadhukhan et al.

(10) Patent No.: US 12,451,840 B2
(45) Date of Patent: Oct. 21, 2025

(54) TRANSFORMER-COUPLED INPUT BUFFER FOR FREQUENCY SYNTHESIS

(71) Applicant: Texas Instruments Incorporated, Dallas, TX (US)

(72) Inventors: Sonam Sadhukhan, Santa Clara, CA (US); Arpan Thakkar, Bangalore (IN); Pranav Kumar, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 18/591,255

(22) Filed: Feb. 29, 2024

(65) Prior Publication Data
US 2025/0202427 A1     Jun. 19, 2025

Related U.S. Application Data

(60) Provisional application No. 63/610,522, filed on Dec. 15, 2023.

(51) Int. Cl.
*H03B 5/12* (2006.01)
*G06F 1/08* (2006.01)
*H03K 17/60* (2006.01)

(52) U.S. Cl.
CPC .............. *H03B 5/1212* (2013.01); *G06F 1/08* (2013.01); *H03K 17/60* (2013.01)

(58) Field of Classification Search
CPC .......... H03B 5/1212; G06F 1/08; H03K 17/60
USPC .......................................................... 327/291
See application file for complete search history.

(56) References Cited

U.S. PATENT DOCUMENTS 7,126,403 B2* 10/2006 Kenney, Jr. .......... H03B 5/1209
                                                    327/299
7,786,785 B2*  8/2010 Kanda ................ H03H 11/1291
                                                    327/300

OTHER PUBLICATIONS

Sadhukhan et al., "A Class-C Injection-Locked Tripler with 48 dB Sub-Harmonic Suppression and 15 fs Additive RMS Jitter in 0.13μm BiCMOS Process," 2022 IEEE International Symposium on Circuits and Systems (ISCAS) (IEEE, 2022, pp. 2740-2744.
Zheng et al., "A Broadband CMOS Frequency Tripler Using a Third-Harmonic Enhanced Technique," J. Solid-State Circ., vol. 42, No. 10 (IEEE, 2007), pp. 2197-2203.
Chan et al., "A 56-65 GHZ Injection-Locked Frequency Tripler With Quadrature Outputs in 90-nm CMOS," J. Solid-State Circ., vol. 43, No. 12 (IEEE, 2008), pp. 2739-2746.
(Continued)

*Primary Examiner* — Tomi Skibinski
(74) *Attorney, Agent, or Firm* — Mandy Barsilai Fernandez; Frank D. Cimino

(57) ABSTRACT

A frequency synthesis circuit includes a first inductor coupled to receive a first input signal at an input frequency, and a second inductor coupled to receive second input signal at the input frequency and out-of-phase relative to the first input signal. The circuit has first and second transistors with control terminals coupled to the first and second inductors, respectively. A first resonant tank of an inductor in parallel with a capacitor is coupled between a power supply terminal and the first transistor. A second resonant tank of an inductor in parallel with a capacitor is coupled between the power supply terminal and the second transistor. The first and second resonant tanks are tuned to a selected harmonic of the input frequency. An injection-locked oscillator has inputs coupled to the first and second transistors.

20 Claims, 6 Drawing Sheets

(56) References Cited

OTHER PUBLICATIONS

Razavi, "A study of injection locking and pulling in oscillators," J. Solid-State Circ., vol. 39, No. 9 (IEEE, 2004), pp. 1415-1424.
Bhat et al., , "Low 1/f Phase Noise Quadrature LC VCOs," Trans. Circ. Sys. I: Regular Papers, vol. 65, No. 7 (IEEE, 2018), pp. 2127-2138.
Adler, "A Study of Locking Phenomena in Oscillators," Proc. IEEE, vol. 61, No. 10 (IEEE, 1973), pp. 1380-1385.
Paciorek, "Injection Locking of Oscillators," Proc. IEEE, vol. 53, No. 11 (IEEE, 1965), pp. 1723-1727.

\* cited by examiner

TRANSFORMER-COUPLED INPUT BUFFER FOR FREQUENCY SYNTHESIS

CROSS-REFERENCE TO RELATED APPLICATIONS

This application claims priority, under 35 U.S.C. § 119 (e), to U.S. Provisional Patent Application No. 63/610,522, filed Dec. 15, 2023, which is incorporated herein by reference.

BACKGROUND

This specification relates to frequency synthesis circuits, and more specifically to frequency synthesis circuits based on injection locked oscillators.

Frequency synthesis circuits, also referred to as clock generator circuits, are commonly used in many electronic systems to generate stable periodic signals, such as clock signals. Clock signals generated by frequency synthesis circuits are used to clock data converter circuits, for example analog-to-digital and digital-to-analog converters, and are used as reference clocks in test and measurement systems, as system clocks in digital processing circuits, and the like. Some wireless and wireline communications transceivers include frequency synthesis circuits in the form of local oscillators that generate clock signals used in the down-conversion of received signals and the up-conversion of signals to be transmitted.

SUMMARY

According to an example, a frequency synthesis circuit includes a first transistor having a first conduction terminal, a second conduction terminal coupled to a common potential, and a control terminal, and a second transistor having a first conduction terminal, a second conduction terminal coupled to the common potential, and a control terminal. A first tank inductor and a first tank capacitor each have a first terminal coupled to a power supply terminal and a second terminal coupled to the first conduction terminal of the first transistor. A second tank inductor and a second tank capacitor each have a first terminal coupled to the power supply terminal and a second terminal coupled to the first conduction terminal of the second transistor. A first inductor is coupled between a first input and the control terminal of the first transistor, and a second inductor is coupled between a second input and the control terminal of the second transistor. An injection-locked oscillator has a first injection input coupled to the first conduction terminal of the second transistor, and a second injection input coupled to the first conduction terminal of the first transistor.

According to another example, a frequency synthesis circuit includes a first inductor coupled to receive a first input signal at an input frequency, and a second inductor coupled to receive second input signal at the input frequency and out-of-phase relative to the first input signal. The circuit has first and second transistors, with control terminals coupled to the first and second inductors, respectively. A first resonant tank of an inductor in parallel with a capacitor is coupled between a power supply terminal and the first transistor. A second resonant tank of an inductor in parallel with a capacitor is coupled between the power supply terminal and the second transistor. The first and second resonant tanks are tuned to a selected harmonic of the input frequency. An injection-locked oscillator has inputs coupled to the first and second transistors.

According to another example, an input buffer circuit includes first and second transistors, each having a first conduction terminal, a second conduction terminal coupled to a common potential, and a control terminal. A first tank inductor and a first tank capacitor each have a first terminal coupled to a power supply terminal and a second terminal coupled to the first conduction terminal of the first transistor, and a second tank inductor and a second tank capacitor each have a first terminal coupled to the power supply terminal and a second terminal coupled to the first conduction terminal of the second transistor. A first inductor is coupled between a first input and the control terminal of the first transistor, and a second inductor is coupled between a second input and the control terminal of the second transistor.

Example technical advantages enabled by one or more of these examples include the use of regenerative feedback in a transformer-coupled input buffer to enhance injection current with a strong harmonic component to an injection-locked oscillator. This enhancement of injection current from regenerative feedback avoids increasing bias current to the injection locked oscillator, which can load resonant tanks in the oscillator. Reduced out-of-band phase noise can be exhibited by a frequency multiplier including the input buffer and injection-locked oscillator to provide frequency multiplication with a high jitter tracking bandwidth. Good sub-harmonic rejection ratio (SHRR) performance is also enabled.

Other example technical advantages enabled by the disclosed examples are apparent to those of ordinary skill in the art having reference to the following specification together with its drawings.

BRIEF DESCRIPTION OF THE DRAWINGS

The same reference numbers or other reference designators are used in the drawings to illustrate the same or similar (in function and/or structure) features.

DETAILED DESCRIPTION

Frequency synthesis circuits may be embedded within larger-scale integrated circuits, such as "analog front end" circuits for radio frequency (RF) transceivers and the like, or may be implemented as stand-alone synthesizer integrated circuits. Examples of stand-alone synthesizer integrated circuits include the LMX1204 and LMX2820 synthesizer integrated circuits available from Texas Instruments Incorporated. According to one architecture, frequency synthesis circuits may include an on-chip frequency multiplier for increasing the frequency of a lower frequency clock signal by some integer multiple, such as 2 or 3, to an intermediate frequency for up- and down-conversion. This architecture is especially useful in high frequency applications such as modern communications transceivers operating in the GHz range, and high rate data converters, because the higher frequency output clock can be based on a low jitter clock signal that is more readily generated at a lower frequency.

Examples of frequency multipliers include phase-locked loops (PLLs), open loop frequency doublers based on unbalanced source-coupled or emitter-coupled transistor pairs, and injection-locked oscillators (ILOs). More particularly, ILOs include an oscillator, for example cross-coupled transistors with resonant tank loads that are tuned to a selected harmonic, such as the third harmonic, of an input reference frequency applied at injection transistors. The injection transistors are biased to facilitate non-linear conduction. The combination of this non-linear conduction and the tuned resonant tanks inject current at the harmonic frequency into the oscillator. The oscillator locks at that harmonic frequency, generating an output periodic signal at a multiple of the reference frequency.

Figure 1:
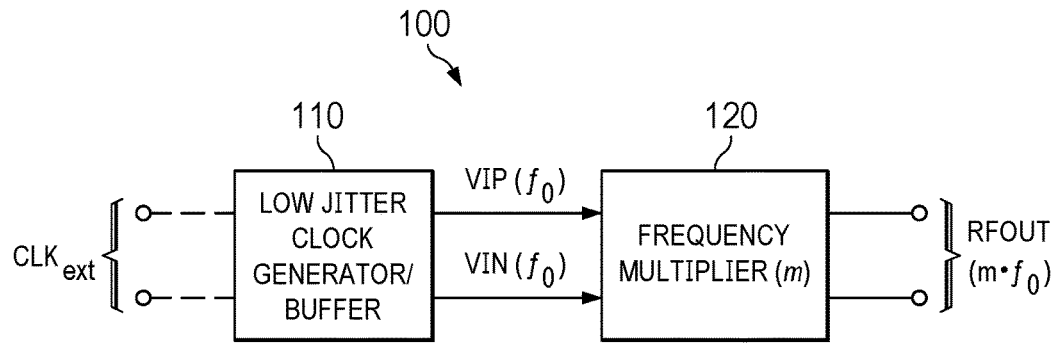
FIG. 1 is an electrical diagram, in block form, of an example frequency synthesis circuit.

FIG. 1 illustrates an example frequency synthesis circuit 100. Frequency synthesis circuit 100 may alternatively be referred to as a clock generator or timing signal generator, among other terms. Frequency synthesis circuit 100 includes clock generator/buffer 110 and frequency multiplier 120.

Clock generator/buffer 110 may be constructed as a clock generator circuit that generates a periodic output signal at a selected frequency, for example a frequency based on an external crystal oscillator or the like that is coupled to terminals $CLK_{ext}$. Alternatively, clock generator/buffer 110 may be constructed as a buffer receiving an externally-sourced periodic signal at terminals $CLK_{ext}$. In either case, clock generator/buffer 110 generates a periodic signal (e.g., a sinusoid signal waveform) at conductors VIP, VIN at a selected reference frequency $f_0$. In this example, the periodic signals at conductors VIP, VIN are 180° out of phase relative to one another; alternatively, clock generator/buffer 110 may output a single-ended periodic signal. In one example, clock generator/buffer 110 generates its output periodic signal with very low deviation from reference frequency $f_0$, such deviation referred to as "jitter." For example, reference frequency $f_0$ generated by clock generator/buffer 110 may be on the order of 2 GHZ, with a root-mean-square jitter of on the order of 50 fsec.

Frequency multiplier 120 has inputs receiving the opposite-phase reference frequency signals at conductors VIP, VIN, and has one or more outputs RFOUT. Frequency multiplier 120 is constructed to present, at outputs RFOUT, one or more periodic signals at a frequency m times the input reference frequency $f_0$. In this example, m is an integer multiple, for example m=3. Similarly as the input signals at conductors VIP, VIN, a pair of signals 180° out of phase relative to one another may be provided by frequency multiplier 120 at its outputs RFOUT.

Various circuits have been used as frequency multipliers. One type of frequency multiplier is the phase-locked loop (PLL), in which a frequency divider in the feedback loop determines the frequency multiplier m. However, it has proven difficult for PLLs to attain suitable phase noise, or jitter, performance at the gigahertz (e.g., mm-wavelength) frequencies required by modern communications and other systems. The PLL components of phase-frequency detector, charge pump, and loop filter elements have been observed to add significant in-band noise, especially at the higher frequencies. Power consumption can also be undesirably large in PLLs.

Another type of frequency multiplier is an open loop doubler, for example based on unbalanced source-coupled or emitter-coupled transistor pairs. However, open loop doubler implementations have been observed to exhibit noise degradation due to the multiple filters included in this approach, and also suffer from undesirably high power consumption. Difficult tradeoffs between output noise and sub-harmonic rejection ratio (SHRR) may also be presented by this approach.

It is within this context that the examples described herein arise.

Figure 2:
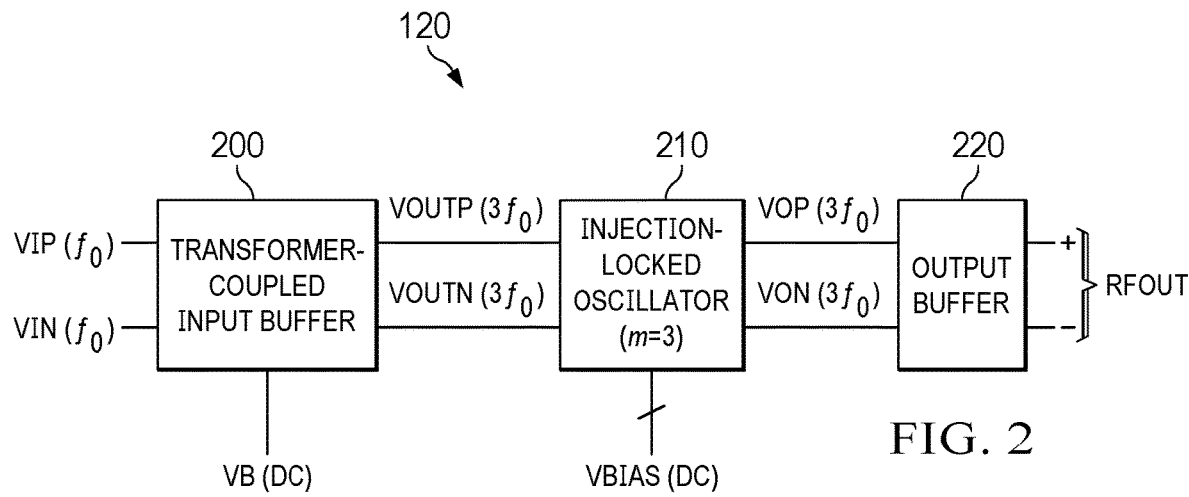
FIG. 2 is an electrical diagram, in block form, of an example frequency multiplier in the frequency synthesis circuit of FIG. 1.

FIG. 2 illustrates the architecture of frequency multiplier 120 according to an example. Frequency multiplier 120 includes transformer-coupled input buffer 200, injection-locked oscillator 210, and output buffer 220.

Input buffer 200 has inputs coupled to conductors VIP, VIN to receive input periodic signals at reference frequency $f_0$ from clock generator/buffer 110 (FIG. 1). In this example, input buffer 200 also has one or more inputs receiving a DC bias voltage VB, at a level appropriate for the particular circuit construction. Input buffer 200 has outputs coupled to conductors VOUTP, VOUTN, which in this example present periodic signals at a frequency multiple m of reference frequency $f_0$. In the example of FIG. 2, frequency multiple m is 3. Similarly as the input periodic signals at conductors VIP, VIN, the signals at conductors VOUTP, VOUTN may be 180° out of phase relative to one another.

Conductors VOUTP, VOUTN are coupled to inputs of injection-locked oscillator 210. In this example, as discussed below, the periodic signals at conductors VOUTP, VOUTN source injection current into injection-locked oscillator 210, at frequency $3f_0$ to which injection-locked oscillator 210 locks. Injection-locked oscillator 210 also has one or more inputs receiving DC bias voltages VBIAS, as appropriate for the particular circuit construction. Injection-locked oscillator 210 has outputs coupled to conductors VOP, VON, which in this example present periodic signals at the reference frequency multiple $3f_0$, and 180° out of phase relative to one another.

Output buffer 220 has inputs coupled to conductors VOP, VON, and has outputs RFOUT. Output buffer 220 produces an output RF signal at the reference frequency multiple $3f_0$ with a drive strength appropriate for downstream circuitry of the system. Such downstream circuitry may include, for example, a frequency mixer in an RF transceiver, clock inputs for data converters, and the like, depending on the system application.

Figure 3A:
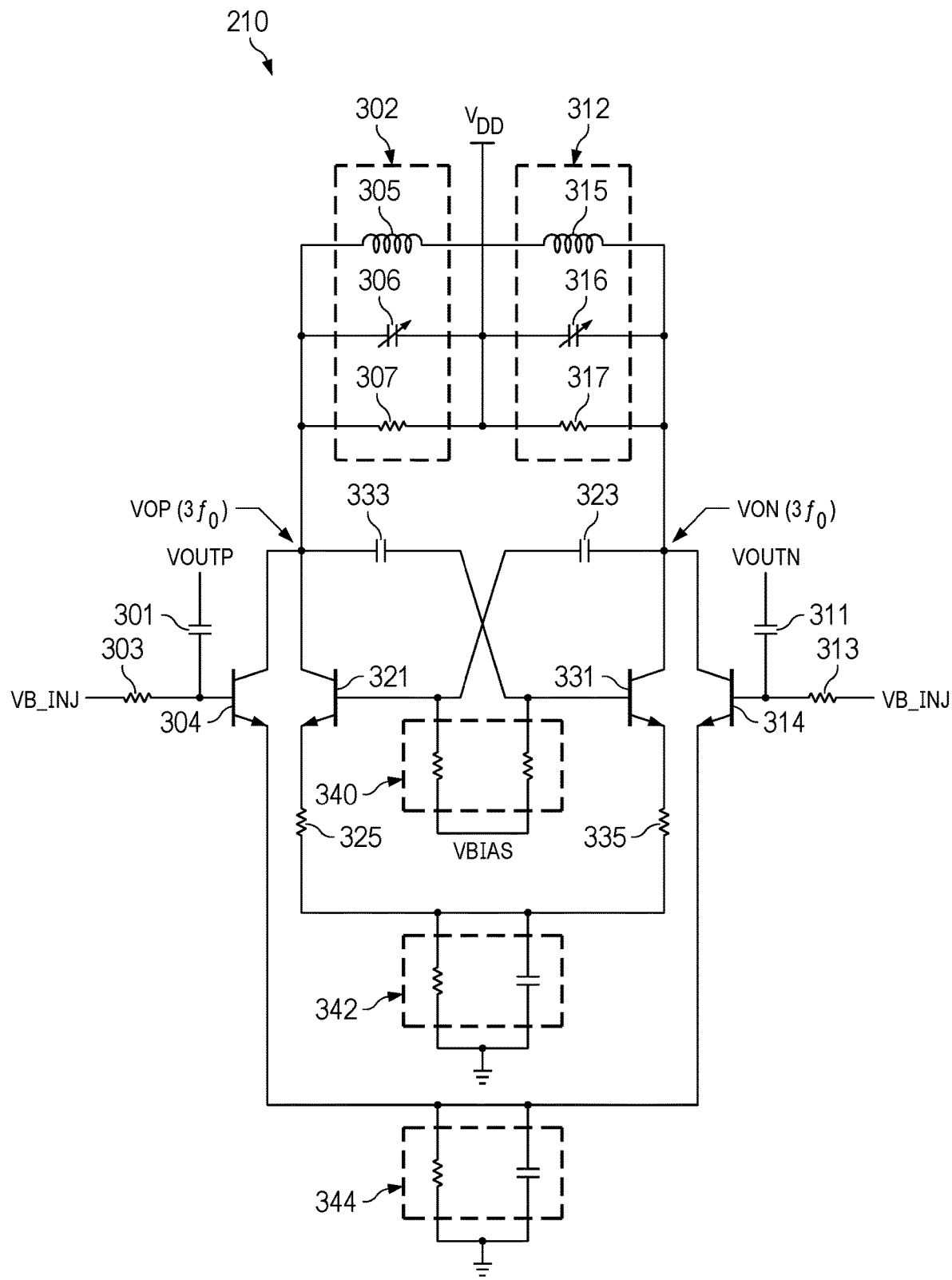
FIG. 3A is an electrical diagram, in schematic form, of an injection-locked oscillator in the frequency multiplier of FIG. 2.

FIG. 3A illustrates the construction of injection-locked oscillator 210 according to an example. In this example in which the frequency multiple m=3, injection-locked oscillator 210 may be referred to as injection-locked tripler (ILT) 210. ILT 210 of FIG. 3A includes injection transistors 304, 314, input capacitors 301, 311, and input resistors 303, 313. ILT 210 further includes resonant tanks 302, 312, transistors 321, 331, capacitors 323, 333, resistor network 340, and resistance-capacitance (RC) networks 342, 344. Resonant tank 302 includes inductor 305, variable capacitor 306, and resistor 307 coupled in parallel between power supply terminal VDD and a terminal of transistor 321. Resonant tank 312 includes inductor 315, variable capacitor 316, and resistor 317 coupled in parallel between power supply terminal VDD and a terminal of transistor 331. Resonant tanks 302, 312 may also be referred to as resonant circuits.

In ILT 210 according to this example, transistors 321 and 331 are bipolar junction transistors (BJTs, or bipolar transistors) cross-coupled with one another. While transistors 321, 331 (and transistors 304, 314) are shown in FIG. 3A as n-p-n BJTs, p-n-p devices may alternatively be used. The base of transistor 321 is coupled to the collector of transistor 331 via capacitor 323, and likewise the base of transistor 331 is coupled to the collector of transistor 321 via capacitor 333. The emitters of transistors are coupled to a terminal at a common potential, at circuit ground, via emitter resistors 325, 335, respectively, and in common via RC network 342. The bases of transistors 321, 331 are biased to a bias voltage VBIAS via corresponding resistors in resistor network 340. Alternatively, network 340 may include inductors in place of resistors, for biasing the bases of transistors 321, 331.

While transistors 304, 314, 321, 331 of ILT 210 are implemented as bipolar junction transistors in this example, ILT 210 may alternatively be implemented using field-effect transistors (FETs), for example metal-oxide semiconductor field-effect transistors (MOSFETs, or MOS transistors).

The collector of transistor 321 is coupled to power supply terminal VDD through resonant tank 302, and the collector of transistor 331 is coupled to power supply terminal VDD through resonant tank 312. Variable capacitors 306, 316 in resonant tanks 302, 312 allow tuning of the resonant frequency of their corresponding resonant tanks 302, 312. In this example in which ILT 210 is a frequency tripler, resonant tanks 302, 312 are tuned to the third harmonic of an input reference frequency $f_0$. Nodes VOP, VON at the collectors of transistors 321, 331 constitute the output nodes of ILT 210. Variable capacitors 306, 316 may be constructed as switched-capacitor networks, or in other programmable or adjustable forms.

Injection transistors 304, 414 are bipolar transistors, each with an emitter coupled to a circuit ground terminal via RC network 344. The collector of injection transistor 304 is coupled to the collector of corresponding transistor 321, and the collector of injection transistor 304 is coupled to the collector of its corresponding transistor 331. Capacitor 301 is coupled between the base of injection transistor 304 and conductor VOUTP. Resistor 303 is coupled between the base of injection transistor 304 and a conductor VB_INJ that receives a DC bias voltage. Similarly, capacitor 311 is coupled between the base of injection transistor 314 and conductor VOUTN. Resistor 313 is coupled between the base of injection transistor 314 and a conductor VB_INJ that receives a DC bias voltage.

In operation, periodic signals of opposing phase are applied from conductors VOUTP, VOUTN to the bases of injection transistors 304, 314. A DC bias voltage at conductors VB_INJ biases injection transistors 304, 314 at a desired operating point, for example at Class-C biasing, which can increase non-linearity in its collector current. Oscillator transistors 321, 331 may also be Class-C biased from DC voltage VBIAS, also to favor non-linear conduction. The combination of non-linear conduction by transistors 321, 331 and injection transistors 304, 314, with the tuning of resonant tanks 302, 312 at the third harmonic frequency $3f_0$, causes ILT 210 to oscillate at the third harmonic frequency $3f_0$. Output periodic signals of opposing phase at frequency $3f_0$ then appears at collector nodes VOP, VON.

Injection-locked oscillators may suffer from a relatively narrow locking frequency range. When applied in a frequency synthesis circuit, this narrow locking range is reflected in a low jitter tracking bandwidth corresponding to a lower corner frequency in the phase noise characteristic of the circuit. The locking range of an ILT can be increased by increasing the bias current of the injection transistors. However, implementations that increase this injection bias current have exhibited a resulting decrease in the impedance presented to the resonant tanks by the higher injection transistor conduction. This decreased impedance loads the resonant tanks, degrading the LC quality factor (Q), which degrades the phase noise characteristic of the ILT.

Figure 3B:
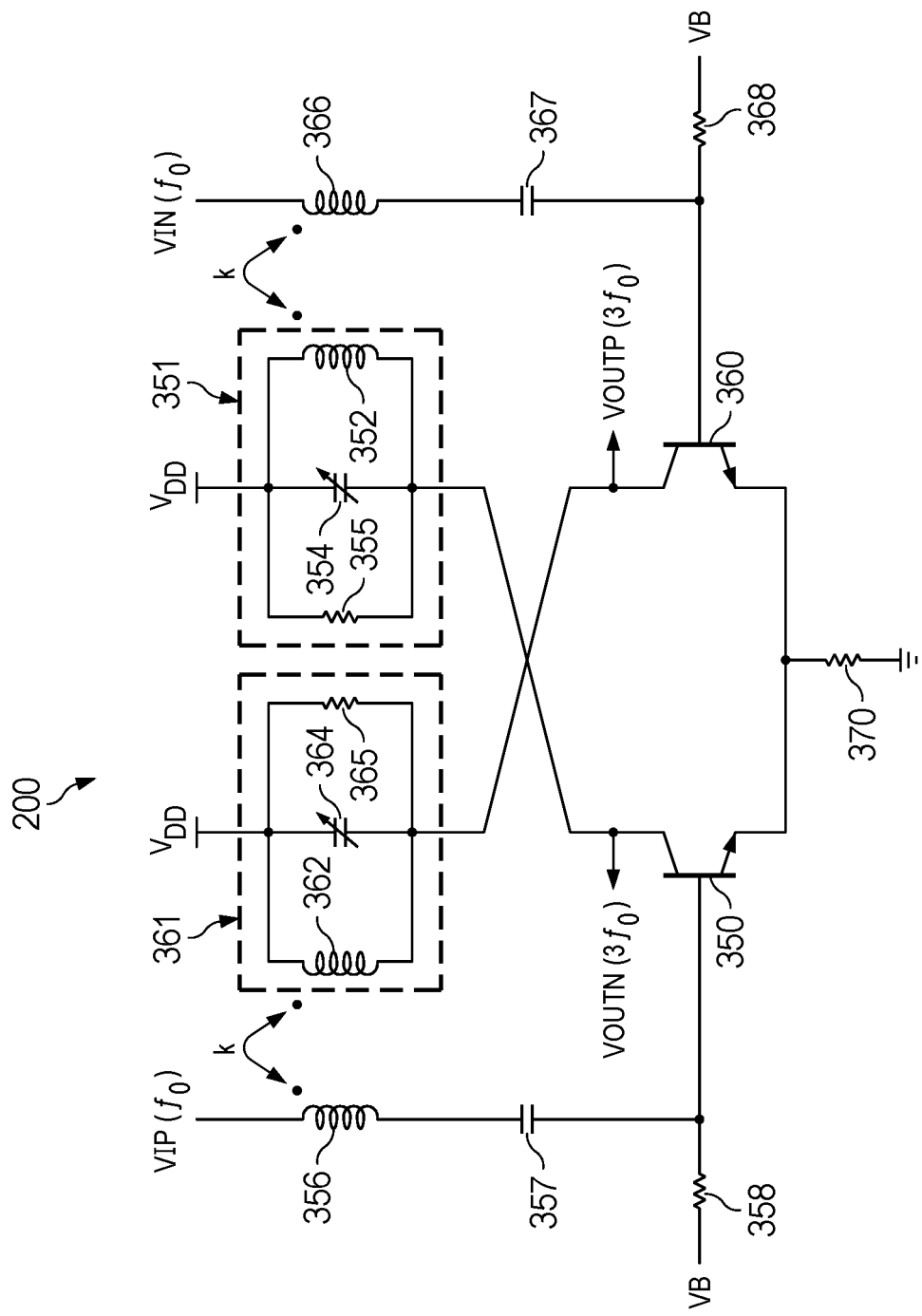
FIG. 3B is an electrical diagram, in schematic form, of an example input buffer in the frequency multiplier of FIG. 2.

FIG. 3B illustrates the construction of transformer-coupled input buffer 200 according to an example. Input buffer 200 includes bipolar transistors 350, 360, resonance tanks 351, 361, inductors 356, 366, capacitors 357, 367, and resistors 358, 368, and 370. Resonance tank 351 includes inductor 352, variable capacitor 354, and resistor 355. Resonance tank 361 includes inductor 362, variable capacitor 364, and resistor 365.

Transistors 350 and 360 are n-p-n BJTs in this example of transformer-coupled input buffer 200. Resistor 358 is coupled between the base of transistor 350 and conductor VB. Series-connected capacitor 357 and inductor 356 are coupled between the base of transistor 350 and conductor VIP. Similarly, resistor 368 is coupled between the base of transistor 360 and conductor VB. Series-connected capacitor 367 and inductor 366 are coupled between the base of transistor 360 and conductor VIN. The emitters of transistors 350 and 360 are coupled to a terminal at common potential, for example at circuit ground, through tail resistor 370.

The collector of transistor 350 is coupled to resonance tank 351. Each of inductor 352, variable capacitor 354, and resistor 355 in resonance tank 351 is coupled between the collector of transistor 350 and a power supply terminal VDD. Similarly, the collector of transistor 360 is coupled to resonance tank 361. Each of inductor 362, variable capacitor 364, and resistor 365 in resonance tank 361 is coupled between the collector of transistor 360 and power supply terminal VDD. Variable capacitors 354, 364 allow tuning of the resonant frequency of their corresponding resonant tanks 351, 361, for example to the same odd harmonic of input reference frequency $f_0$ as the injection-locked oscillator coupled to the collector nodes VOUTP, VOUTN. In this example in which ILT 210 is configured as a frequency tripler, resonant tanks 351, 361 are also tuned to the third harmonic of input reference frequency $f_0$. Variable capacitors 354, 364 may be constructed as switched-capacitor networks, or in other programmable or adjustable forms.

In the example of FIG. 3B, inductor 356, which couples conductor VIP to the base of transistor 350, is inductively coupled to inductor 362 in resonant tank 361 at the collector of transistor 360. Similarly, inductor 366, which couples conductor VIN to the base of transistor 360, is inductively coupled to inductor 352 in resonant tank 351 at the collector of transistor 350. The mutual inductance k of inductors 356 and 362, and of inductors 366 and 352, may vary depending on the implementation. In one example, the mutual inductance k is on the order of 0.6. Alternatively, inductors 356 and 362, and inductors 366 and 352, may not be inductively coupled, in which case mutual inductance k≈0.

Nodes VOUTP, VOUTN at the collectors of transistors 360 and 350, respectively, constitute the output nodes of transformer-coupled input buffer 200. As described above relative to FIG. 3A, these nodes VOUTP, VOUTN are coupled to the inputs of ILT 210, e.g., to the bases of transistors 304, 314, respectively via respective capacitors 301, 311.

While transistors 350, 360 of input buffer 200 are implemented as BJTs in this example, transistors 350, 360 may alternatively be implemented as FETs, for example as MOS transistors.

In operation, periodic signals at input reference frequency $f_0$ are applied at conductors VIP, VIN. The signals at conductors VIP, VIN are 180° out of phase with one another. Conductor VB applies a DC bias voltage to the bases of transistors 350, 360 via resistors 358, 368, respectively. In this example, this bias voltage at conductor VB is slightly below the threshold voltage of transistors 350, 360, to enhance non-linear operation of those devices, particularly at the desired harmonic of reference frequency $f_0$, for example the third harmonic. In one example, the bias voltage at conductor VB is selected to Class-AB bias transistors 350, 360.

Figure 4:
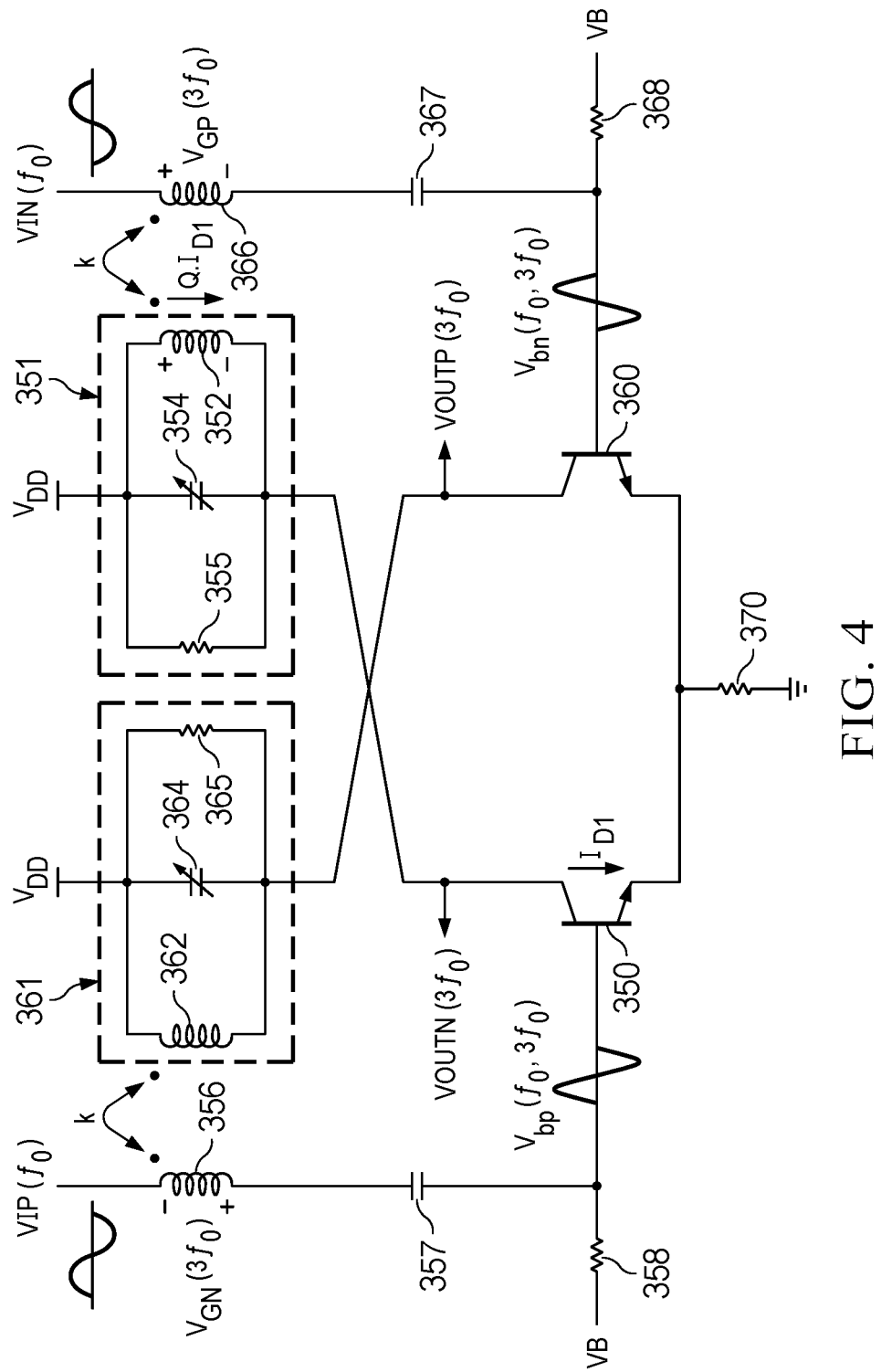
FIG. 4 is an electrical diagram, in schematic form, illustrating the operation of the example input buffer of FIG. 3B.

FIG. 4 illustrates an example of the operation of transformer-coupled input buffer 200, with reference to transistor 350 and resonant tank 351. Transistor 360 and resonant tank 361 operates in a similar fashion. The base of transistor 350 is Class-AB biased by the DC voltage at conductor VB. Initially, the DC voltage at conductor VB and the reference frequency $f_0$ signal at conductor VIP are applied to the base of transistor 350. The voltage $V_{GN}$ at harmonic frequency $3f_0$ across inductor is initially zero, but builds over time as described below.

In this example, collector current $I_{D1}$ of transistor 350 may be expressed as:

$$I_{D1}(f) = I_0 + g_{m1}V_{bp}(f_0) + g_{m2}V_{bp}(2f_0) + g_{m3}V_{bp}(3f_0) + \ldots \quad (1)$$

where $I_0$ is the DC collector current and $V_{bp}$ is the base voltage of transistor 350, and where the $g_m$ factors are transconductances of transistor 350 at the indicated harmonic frequencies. A corresponding current $Q \cdot I_{D1}$ flows through inductor 352, where Q is the quality factor of resonant tank 351. This current $Q \cdot I_{D1}$ includes a component at the resonant frequency of resonant tank 351, which in this example is $3f_0$.

The harmonic current $Q \cdot I_{D1}(3f_0)$ conducted by inductor 352 develops a corresponding voltage $V_{GP}$ across inductor 366 due to regenerative feedback from the inductive coupling k between inductor 352 and inductor 366. The third harmonic component of this voltage $V_{GP}$ corresponds to:

$$V_{GP}(3f_0) = [Q \cdot I_{D1}(3f_0)] \cdot k \cdot j6\pi f_0 \quad (2)$$

The voltage $V_{GP}$ across inductor 366 also includes a component at the harmonic frequency $3f_0$, and adds constructively to the reference frequency $f_0$ signal applied from conductor VIN. Voltage $V_{bn}$ at the base of transistor 360 can be expressed as:

$$V_{bn} = V_{1N}(f_0) + V_{GP}(3f_0) \quad (3)$$

where $V_{IN}(f_0)$ expresses the voltage at conductor VIN.

The induced third harmonic component in base voltage $V_{bn}$ resulting from inductors 352 and 366 is effectively multiplied by the first order transconductance ($g_{m1}$) of transistor 360, strengthening the third harmonic $3f_0$ of its collector current $I_{D2}$. The third harmonic $3f_0$ component of collector current $I_{D2}$ contributes to the $3f_0$ current conducted by inductor 362 in resonant tank 361. This current is regeneratively fed back into the base of transistor 350 by the inductive coupling of inductor 362 to inductor 356, building voltage $V_{GN}(3f_0)$, which is added in series with voltage $V_{IP}$ (at reference frequency $f_0$), and appears as a third harmonic $3f_0$ component of base voltage $V_{bp}$ of transistor 350. The $3f_0$ component of base voltage $V_{bp}$ is similarly multiplied by the first order transconductance $g_{m1}$ of transistor 350 to strengthen the $3f_0$ component of its collector current $I_{D1}$.

One can derive the magnitude of the third harmonic transconductance magnitude $G_{M3}$ of transistor 350 as:

$$\frac{I_{D1}(3f_0)}{V_{bp}(3f_0)} = G_{M3} = \frac{g_{m3}}{1 - g_{m1}(Q \cdot k \cdot \sqrt{L_{352}L_{366}}6\pi f_0)} \quad (4)$$

where $L_{352}$ and $L_{366}$ are the inductances of inductors 352 and 366, respectively. The same value of third harmonic transconductance magnitude $G_{M3}$ applies to transistor 360, assuming matching inductances on its side of input buffer 200. For stability of input buffer 200, the quantity $g_{m1}(Q \cdot k \cdot \sqrt{L_{352}L_{366}}6\pi f_0)$ should be kept below unity.

As a result of the strong third harmonic conduction in transformer-coupled input buffer 200, the voltages at conductors VOUTP, VOUTN also have a strong third harmonic $3f_0$ component. These voltages are provided to the inputs of ILT 210 at the bases of injection transistors 304, 314, as described above relative to FIGS. 3A and 3B. The third harmonics at conductors VOUTP, VOUTN enhance similar harmonic conduction in ILT 210. According to this example, this enhancement of harmonic conduction is attained without a corresponding increase in the bias current of injection transistors 304, 314 of ILT 210, and thus without significant reduction in the impedance presented by those injection transistors to resonant tanks 302, 312. Generation of a strong output signal from ILT at the tripled frequency $3f_0$ is thus facilitated by input buffer 200 according to this example.

As mentioned above, transistors 350 and 360 are biased in the Class-AB mode by the DC voltage at conductors VB. This bias mode provides a short conduction angle within the period of reference frequency $f_0$, adding at most minimal noise at the output of input buffer 200, and thus at the output of ILT 210.

The value of the transformer coupling coefficient k determines the amount of harmonic conduction in input buffer 200. Simulation has shown the development of a strong third harmonic component $3f_0$ even with no coupling (e.g., k=0). However, inductive coupling of inductors 352 and 366, and of inductors 362 and 356, has been observed to further increase third harmonics in collector currents $I_{D1}$ and $I_{D2}$. In one example, inductive coupling k=0.58 has been observed to in simulation to increase collector currents $I_{D1}$ and $I_{D2}$ by a factor of 2.1 over the case with no inductive coupling (k=0).

Figure 5:
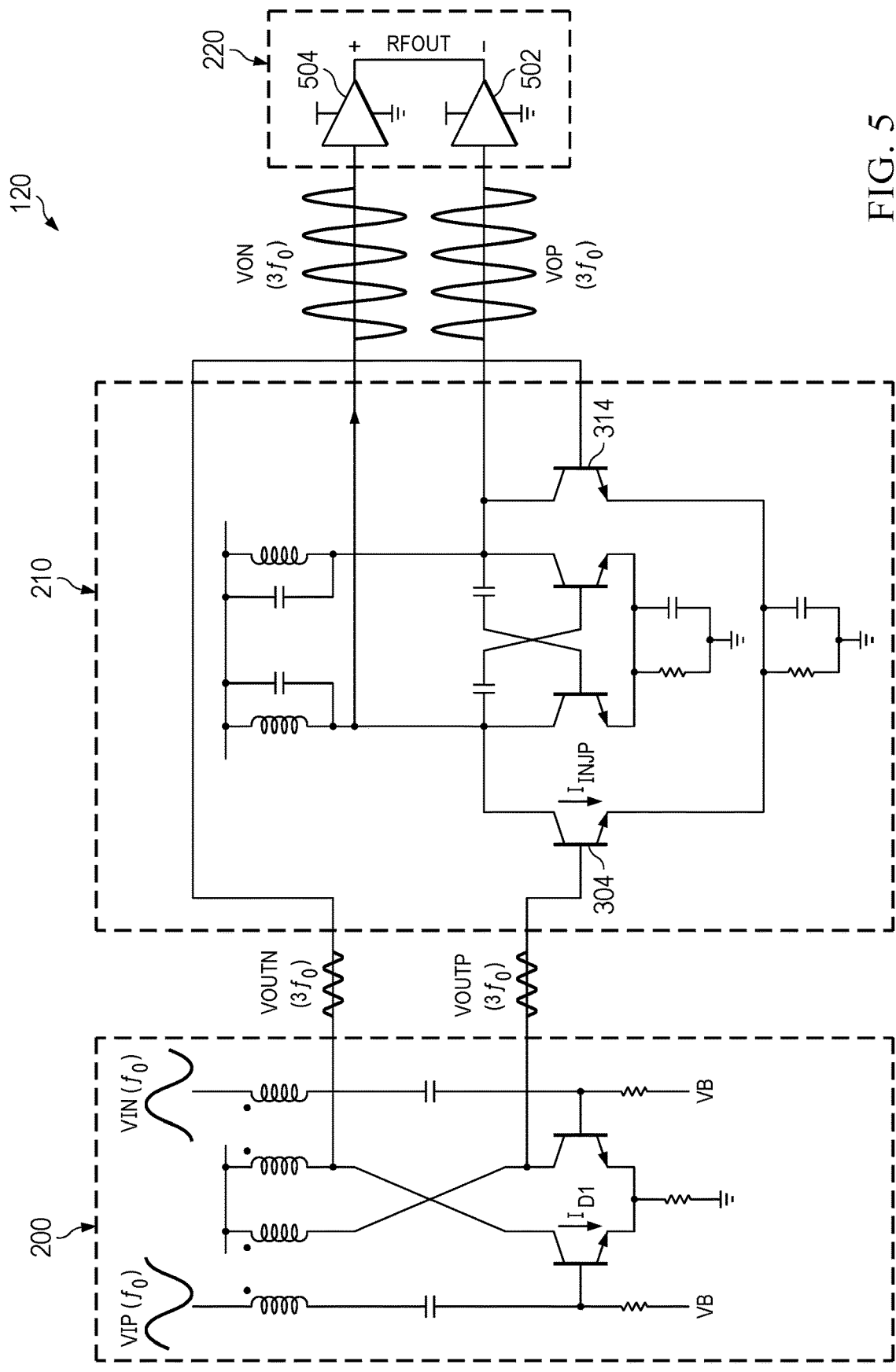
FIG. 5 is an electrical diagram, in schematic form, of the example frequency multiplier of FIG. 2.

FIG. 5 illustrates an example interconnection of transformer-coupled input buffer 200 with ILT 210 and output buffer 220 within frequency multiplier 120. For the sake of clarity, FIG. 5 shows input buffer 200 and ILT 210 in a somewhat simplified form relative to that described above with FIGS. 3A and 3B.

Output buffer 220 in frequency multiplier 120 includes buffers 502 and 504. Buffer 502 has an input coupled to conductor VOP from the output of ILT 210, and buffer 504 has an input coupled to conductor VON from the output of ILT 210. Outputs of buffers 502 and 504 constitute outputs RFOUT from frequency multiplier 120, as shown also in FIG. 2. In this example, the outputs of buffers 502 and 504 are 180° out of phase with one another, corresponding to the opposing phase signals at conductors VOP, VON.

As shown in FIG. 5, periodic signals at the reference frequency $f_0$ are presented on conductors VIP, VIN to transformer-coupled input buffer 200. In frequency synthesis circuit 100 of FIG. 1, these reference frequency signals are generated by clock generator/buffer 110. The input signals at conductors VIP, VIN are of opposing phase (e.g., 180° out of phase with one another). Outputs of transformer-coupled input buffer 200 drive conductors VOUTP, VOUTN with a periodic signal including a component at a selected harmonic of reference frequency $f_0$, which in the above example is the third harmonic $3f_0$. The signals at conductors VOUTP, VOUTN are of opposing phase.

Conductors VOUTP, VOUTN apply periodic signals including a third harmonic frequency $3f_0$ component to the bases of injection transistors 304, 314, respectively, in ILT 210. The amplitude of the third harmonic $3f_0$ component at conductors VOUTP, VOUTN from input buffer 200 is relatively weak. ILT 210 in turn operates to amplify this harmonic signal into output signals at the same third harmonic onto conductors VOP, VON. The signals driven by ILT 210 at conductors VOP, VON are of opposing phase, and at a stronger amplitude than at conductors VOUTP, VOUTN.

Buffers 502, 504 of output buffer 220 generate, at its outputs RFOUT, periodic signals of the harmonic frequency multiple $3f_0$ with drive strength suitable for application to downstream circuitry (e.g., frequency mixer in an RF transceiver, clock inputs for data converters, etc.). Output buffer 220 thus buffers any input loading presented by such downstream circuitry from affecting the operation of ILT 210.

Figure 6:
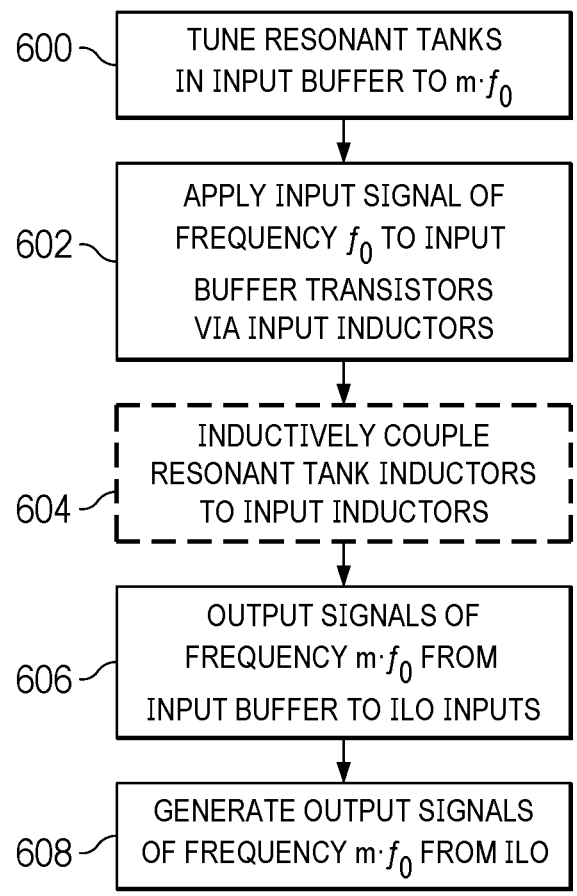
FIG. 6 is a flow diagram illustrating an example frequency synthesis method.

FIG. 6 is a flow diagram illustrating an example method of generating a periodic signal of a frequency corresponding to a selected multiple of an input reference frequency, using the circuits described above in connection with FIGS. 1 through 5.

In process block 600, resonant tanks 351 and 361 of input buffer 200 are tuned to a selected multiple m of a reference frequency $f_0$, for example to a frequency multiple matching the frequency multiplier to be applied by an injection-locked oscillator. For the example of injection-locked tripler (ILT) 210, resonant tanks 351, 361 are tuned in process block 600 to resonate at the third harmonic of the reference frequency $f_0$ (e.g., $3f_0$). In an example implementation, resonant tanks 351, 361 are tuned by applying a control word to switched-capacitor type variable capacitors 354, 364. Resonant tanks in the injection-locked oscillator (e.g., ILT 210) may also be tuned to the same frequency in process block 600 in some implementations.

In process block 602, an input signal at the reference frequency $f_0$ is applied to transistors of input buffer 200 via corresponding input buffers. In the example described above, a clock generator or buffer (e.g., clock generator/buffer 100 of FIG. 1) generates or receives a periodic signal at the reference frequency $f_0$ and applies opposing phase (180°) versions of the signal to conductors VIP, VIN. These conductors VIP, VIN are inductively coupled via inductors 356, 366, respectively, to the bases of bipolar transistors 350, 360, respectively, which receive the input reference signal along with a DC bias voltage. In this example, transistors 350, 360 are Class-AB biased by a DC bias voltage slightly below the threshold voltage of transistors 350, 360 (e.g., the threshold voltage of the base-emitter junctions). This bias condition is favorable to non-linearity in the collector current, such as at the harmonic of interest of reference frequency $f_0$.

As a result of the application of the input reference signal in process 602, collector current is conducted by input buffer transistors 350, 360 through resonant tanks 351, 361. Because these resonant tanks 351, 361 are tuned to a selected multiple m of the reference frequency $f_0$ in process block 600, along with the bias conditions at transistors 350, 360, this collector current includes a significant component at the selected harmonic. This harmonic component is multiplied by the first order transconductance ($g_{m1}$), which in turn results in higher harmonic current from regenerative feedback.

Optionally, input buffer 200 may be constructed so that inductors 352, 362 in resonant tanks 351, 361 are inductive coupled with input inductors 366, 356, respectively (process block 604). With inductive coupling, improvement in the overall performance of the ILT can be achieved. However, for simplicity, the circuit can instead be used without inductive coupling, but with some compromise in performance. For example, inductive coupling at a coefficient k=0.58 has been observed to more than double the magnitude of the third harmonic $3f_0$, as compared with no inductive coupling (k=0).

In process block 606 of FIG. 6, output signals from the input buffer are applied to inputs of an injection-locked oscillator. In the example described above, the collectors of transistors 360, 350 are coupled to conductors VOUTP, VOUTN, respectively, and provide the output signals from input buffer 200. For the example of ILT 210, conductors VOUTP, VOUTN are coupled to the inputs of ILT 210 at the bases of injection transistors 304, 314. Injection of signals at the selected harmonic $m \cdot f_0$ (e.g., $3f_0$) from input buffer 200 causes ILT 210 to oscillate at that frequency, and to generate corresponding output signals at conductors VOP, VON at that frequency $m \cdot f_0$ in process block 608.

As described above for the example of frequency multiplier 120 of FIG. 5, output buffer 220 receives and buffers the output signals at conductors VOP, VON. Output buffer 220 drives corresponding signals at outputs RFOUT to downstream circuitry.

The described examples enable important advantages in frequency multipliers. Regenerative feedback in a transformer-coupled input buffer enhances harmonic conduction, for example at a selected harmonic of an input reference frequency, by way of collector-to-base coupled induction. The input buffer can thus source injection current with a strong harmonic component to the inputs of an injection-locked oscillator, without a corresponding increase in bias current of the injection transistors to the injection-locked oscillator, which can load the resonant tanks in the oscillator. Reduced out-of-band phase noise is thus provided by the frequency multiplier, providing frequency multiplication with a high jitter tracking bandwidth. Good sub-harmonic rejection ratio (SHRR) performance is also enabled by these examples.

Examples are described in this specification as implemented into a frequency tripler using bipolar junction transistors, as such implementation is advantageous in that context. Aspects of these examples may be beneficially applied in alternative applications, for example frequency multiplication at different multiples, and in alternative ways, for example using field-effect transistors such as MOSFETs. Accordingly, the following description is provided by way of example only, and is not intended to limit the true scope as claimed.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device, or other electronics or semiconductor component.

Unless otherwise stated, "about," "approximately," or "substantially" preceding a value means+/−10 percent of the stated value. Modifications are possible in the described examples, and other examples are possible within the scope of the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party. While, in some example embodiments, certain elements are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

Modifications are possible in the described examples, and other examples are possible, within the scope of the claims.

What is claimed is:

1. A frequency synthesis circuit, comprising:
   a first transistor having a first terminal, a second terminal, and a control terminal;
   a second transistor having a first terminal, a second terminal, and a control terminal;
   a first inductor having a first terminal, and having a second terminal coupled to the first terminal of the first transistor;
   a first capacitor having a first terminal coupled to the first terminal of the first inductor and having a second terminal coupled to the first terminal of the first transistor;
   a second inductor having a first terminal, and having a second terminal coupled to the first terminal of the second transistor;
   a second capacitor having a first terminal coupled to the first terminal of the second inductor and having a second terminal coupled to the first terminal of the second transistor;
   a third inductor coupled between a first input and the control terminal of the first transistor;
   a fourth inductor coupled between a second input and the control terminal of the second transistor; and
   an injection-locked oscillator having a first input coupled to the first terminal of the second transistor, and a second input coupled to the first terminal of the first transistor.

2. The circuit of claim 1, wherein the third inductor is inductively coupled to the second inductor and the fourth inductor is inductively coupled to the first inductor.

3. The circuit of claim 1, wherein the control terminals of the first and second transistors are coupled to first and second bias inputs, respectively.

4. The circuit of claim 1, wherein the first and second inputs receive first and second input signals at an input frequency, the first and second input signals being 180° out of phase from one another;
   and wherein a resonant frequency of a network of the first inductor and first capacitor, and of a network of the second inductor and second capacitor, is a selected harmonic of the input frequency.

5. The circuit of claim 4, wherein the first and second capacitors are variable capacitors.

6. The circuit of claim 4, wherein the injection-locked oscillator is a frequency tripler;
   and wherein the resonant frequency is a third harmonic of the input frequency.

7. The circuit of claim 1, wherein the injection-locked oscillator has first and second outputs;
   and further comprising:
   an output buffer having first and second inputs coupled to the first and second outputs of the injection-locked oscillator.

8. The circuit of claim 1, wherein the first and second transistors are bipolar junction transistors.

9. A frequency synthesis circuit, comprising:
   a first inductor having a first terminal coupled to receive a first input signal at an input frequency and having a second terminal;
   a second inductor having a second terminal coupled to receive a second input signal at the input frequency and out-of-phase relative to the first input signal, the second inductor having a second terminal;
   a first transistor having a first terminal, a second terminal coupled to a common terminal, and a control terminal coupled to the second terminal of the first inductor;
   a second transistor having a first terminal, a second terminal coupled to the common terminal, and a control terminal coupled to the second terminal of the second inductor;

a first resonant tank comprising an inductor and a capacitor coupled in parallel between a power supply terminal and the first terminal of the first transistor, the first resonant tank tuned to a selected harmonic of the input frequency;

a second resonant tank comprising an inductor and a capacitor coupled in parallel between the power supply terminal and the first terminal of the second transistor, the second resonant tank tuned to the selected harmonic of the input frequency; and an injection-locked oscillator having inputs coupled to the first terminals of the first and second transistors.

10. The circuit of claim 9, wherein the first and second inductors are capacitively coupled to the control terminals of the first and second transistors, respectively.

11. The circuit of claim 10, further comprising:

first and second bias inputs coupled to the control terminals of the first and second transistors, respectively, the first and second bias inputs receiving a bias voltage selected to bias the first and second transistors in Class-AB operating mode.

12. The circuit of claim 9, wherein the capacitors of the first and second resonant tanks are variable capacitors, each controllable to tune a resonant frequency of the first and second resonant tanks, respectively, to the selected harmonic of the input frequency.

13. The circuit of claim 9, wherein the inductor of the second resonant tank is inductively coupled to the first inductor, and the inductor of the first resonant tank is inductively coupled to the second inductor.

14. The circuit of claim 9, wherein the injection-locked oscillator comprises:

a first injection transistor having a first terminal, a control terminal coupled to the first terminal of the second transistor, and a second terminal coupled to a common terminal;

a second injection transistor having a first terminal, a control terminal coupled to the first terminal of the first transistor, and a second terminal coupled to the common terminal;

a first oscillator resonant tank comprising an inductor and a capacitor (306) coupled in parallel between the power supply terminal and the first terminal of the first injection transistor;

a second oscillator resonant tank comprising an inductor and a capacitor coupled in parallel between the power supply terminal and the first terminal of the second injection transistor;

first and second oscillator transistors coupled to the first and second oscillator resonant tanks, respectively, and having control terminals cross-coupled with each other.

15. The circuit of claim 14, further comprising:

an output buffer having first and second inputs coupled to the first terminals of the first and second injection transistors, respectively.

16. A circuit, comprising:

a first transistor having a first terminal, a second terminal, and a control terminal;

a second transistor having a first terminal, a second terminal, and a control terminal;

a first inductor having a first terminal, and having a second terminal coupled to the first terminal of the first transistor;

a first capacitor having a first terminal coupled to the first terminal of the first inductor, and having a second terminal coupled to the first terminal of the first transistor;

a second inductor having a first terminal, and having a second terminal coupled to the first terminal of the second transistor;

a second capacitor having a first terminal coupled to the first terminal of the second inductor, and having a second terminal coupled to the first terminal of the second transistor;

a third inductor coupled between a first input and the control terminal of the first transistor;

a fourth inductor coupled between a second input and the control terminal of the second transistor.

17. The circuit of claim 16, wherein the third inductor is inductively coupled to the second inductor and the fourth inductor is inductively coupled to the first inductor.

18. The circuit of claim 16, wherein the control terminals of the first and second transistors are coupled to first and second bias inputs, respectively.

19. The circuit of claim 16, wherein the first and second inputs receive first and second input signals at an input frequency, the first and second input signals being 180° out of phase from one another;

and wherein a resonant frequency of a network of the first inductor and first capacitor, and of a network of the inductor and second capacitor, is a selected harmonic of the input frequency.

20. The circuit of claim 19, wherein the first and second capacitors are variable capacitors.

* * * * *